(12) United States Patent
Lei et al.

(10) Patent No.: US 6,494,955 B1
(45) Date of Patent: Dec. 17, 2002

(54) CERAMIC SUBSTRATE SUPPORT

(75) Inventors: Lawrence Chung-Lai Lei, Milpitas, CA (US); Sal Umotoy, Antioch, CA (US); Xiaoxiong Yuan, Cupertino, CA (US); Anzhong Chang, San Jose, CA (US); Hongbee Teoh, Saratoga, CA (US); Anh N. Nguyen, Milpitas, CA (US); Ron Rose, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 135 days.

(21) Appl. No.: 09/596,854

(22) Filed: Jun. 19, 2000

Related U.S. Application Data

(63) Continuation-in-part of application No. 09/504,288, filed on Feb. 15, 2000.

(51) Int. Cl.$^7$ .................. H01L 21/205; H01L 21/3605; C23C 16/00
(52) U.S. Cl. ...................... 118/715; 118/724; 118/725; 118/728; 156/345.51; 156/345.52
(58) Field of Search ................................. 118/725, 728, 118/729, 730, 500; 156/345

(56) References Cited

U.S. PATENT DOCUMENTS

| | | | |
|---|---|---|---|
| 4,997,677 A | * | 3/1991 | Wang et al. ................ 118/715 |
| 5,155,652 A | | 10/1992 | Logan et al. ................ 361/234 |
| 5,207,437 A | * | 5/1993 | Barnes et al. .................. 269/8 |
| 5,242,501 A | | 9/1993 | McDiarmid .................. 118/728 |
| 5,280,156 A | | 1/1994 | Niori et al. .................. 219/385 |
| 5,306,895 A | | 4/1994 | Ushikoshi et al. .......... 219/385 |
| 5,462,603 A | | 10/1995 | Murakami ................... 118/719 |
| 5,476,548 A | | 12/1995 | Lei et al. ..................... 118/728 |
| 5,505,779 A | | 4/1996 | Mizuno et al. .............. 118/719 |
| 5,516,367 A | | 5/1996 | Lei et al. ..................... 118/725 |
| 5,581,874 A | | 12/1996 | Aoki et al. ..................... 29/825 |
| 5,620,525 A | * | 4/1997 | van de Ven et al. ........ 118/724 |
| 5,643,483 A | | 7/1997 | Kubota et al. ............... 219/543 |
| 5,665,260 A | | 9/1997 | Kawada et al. .............. 219/464 |
| 5,676,758 A | | 10/1997 | Hasegawa et al. ....... 118/173 E |
| 5,688,331 A | | 11/1997 | Aruga et al. ................ 118/725 |
| 5,695,568 A | | 12/1997 | Sinha et al. ................. 118/729 |

(List continued on next page.)

FOREIGN PATENT DOCUMENTS

| | | | |
|---|---|---|---|
| EP | 0 668 607 | 8/1995 | .......... H01L/21/00 |
| WO | 99/67440 | 12/1999 | ........... C23C/16/44 |

OTHER PUBLICATIONS

Yodovsky et al. "Fastening Device for Purge Ring" U.S. patent application No. 09/504,288 filed Feb. 15, 2000.
European Search Report from EP 01 30 5217, Dated Sep. 12, 2001.
Search Report for EP No. 01301314.9, dated Jun. 13, 2001.
Shamouilian, et al., "Multi–Layer Ceramic Electrostatic Chuck with Integrated Channel", U.S. patent application, Ser. No. 09/149,807, filed Sep. 8, 1998.
Yudovsky, et al., "Self Aligning Non Contact Shadow Ring Process Kit", U.S. patent application, Ser. No. 09/459,313, filed Dec. 10, 1999.

Primary Examiner—Gregory Mills
Assistant Examiner—Ram N Kackar
(74) Attorney, Agent, or Firm—Moser, Patterson, and Sheridan, LLP

(57) ABSTRACT

A substrate support assembly for supporting a substrate during processing is provided. In one embodiment, a support assembly includes a top ceramic plate having a first side, a bottom ceramic plate having a first side and an embedded electrode, the first side of the bottom plate fused to the first side of the top plate defining a channel therebetween. In another embodiment, a support assembly includes a first plate having a first side and second side. A ring is disposed on the first side. A stepped surface is formed on the first side radially inward of the ring. A second plate is connected to the second side of the first plate.

35 Claims, 4 Drawing Sheets

U.S. PATENT DOCUMENTS

| | | | |
|---|---|---|---|
| 5,721,062 A | 2/1998 | Kobayashi | 428/688 |
| 5,766,363 A | 6/1998 | Mizuno et al. | 118/725 |
| 5,796,074 A | 8/1998 | Edelstein et al. | 219/390 |
| 5,800,686 A | 9/1998 | Littau et al. | 204/298.07 |
| 5,882,419 A | 3/1999 | Sinha et al. | 118/729 |
| 5,886,863 A | 3/1999 | Nagasaki et al. | 361/234 |
| 5,935,338 A | 8/1999 | Lei et al. | 118/725 |
| 5,994,678 A * | 11/1999 | Zhao et al. | 118/722 |
| 6,035,101 A | 3/2000 | Sajoto et al. | 392/416 |
| 6,045,862 A | 4/2000 | Mizukami et al. | 427/248.1 |
| 6,053,982 A * | 4/2000 | Halpin et al. | 118/500 |
| 6,113,702 A * | 9/2000 | Halpin et al. | 118/500 |
| 6,173,673 B1 * | 1/2001 | Golovato et al. | 118/723 E |
| 6,179,924 B1 * | 1/2001 | Zhao et al. | 118/725 |
| 6,189,482 B1 | 2/2001 | Zhao et al. | 118/723 R |
| 6,204,489 B1 * | 3/2001 | Katsuda et al. | 118/725 |
| 6,267,839 B1 | 7/2001 | Shamouilian et al. | 156/345 |

* cited by examiner

CERAMIC SUBSTRATE SUPPORT

This application is a continuation-in-part of co-pending U.S. patent application Ser. No. 09/504,288, filed Feb. 15, 2000, entitled "Fastening Device for a Purge Ring", which is hereby incorporated by reference in its entirety.

BACKGROUND OF THE DISCLOSURE

1. Field of Invention

The invention relates generally to an apparatus for supporting a substrate in a semiconductor processing chamber.

2. Background of the Invention

Integrated circuits have evolved into complex devices that can include millions of transistors, capacitors and resistors on a single chip. The evolution of chip designs continually requires faster circuitry and greater circuit density that demand increasingly precise fabrication processes. One fabrication process frequently used is chemical vapor deposition (CVD).

Chemical vapor deposition is generally employed to deposit a thin film on a substrate or semiconductor wafer. Chemical vapor deposition is generally accomplished by introducing a precursor gas in to a vacuum chamber. The precursor gas is typically directed through a showerhead situated near the top of the chamber. The precursor gas reacts to form a layer of material on a surface of the substrate that is positioned on a heated substrate support. Purge gas is routed through holes in the support to the edge of the substrate to prevent deposition at the substrate's edge that may cause the substrate to adhere to the support. Volatile by-products produced during the reaction are pumped from the chamber through an exhaust system.

One material frequently formed on substrates using a chemical vapor deposition process is tungsten. A precursor gas that may be used to form tungsten generally includes tungsten hexafluoride ($WF_6$) and silane. As the silane and tungsten hexafluoride mix, some "stray" tungsten (i.e., tungsten that does not deposit on the substrate) deposits on the showerhead and other chamber components. The stray tungsten film builds on the showerhead and may become a source of contamination in the chamber. Eventually, the stray tungsten may clog the holes in the showerhead that facilitate the passage of the precursor gas therethrough necessitating the showerhead be removed and cleaned or replaced.

To extend the interval in time between the routine maintenance of the showerhead, fluorine based chemistries are generally used to clean (i.e., etch away) the stray tungsten film. However, the use of fluorine, while advantageous for removing tungsten, reacts to form a layer of aluminum fluoride on the heated support that is commonly made of aluminum. The aluminum fluoride layer has a generally rough surface topography. The rough surface creates a leak path that impairs the vacuum used to chuck or hold the substrate to the heated support. Additionally, the aluminum fluoride layer is a potential source of particulate contamination.

Substrate supports fabricated from ceramic materials provide an improvement over aluminum supports due to ceramic's resistance to fluorine. However, ceramic supports are difficult to fabricate. For example, the holes in ceramic support used to provide purge gas to the perimeter of the support are typically drilled from the perimeter of the support to a depth generally equal to the radius of the support. Drilling such a deep hole in ceramic is difficult. The tools used to make these holes are frequently broken during the fabrication (e.g., drilling) process. Broken tools disposed within the support must be removed or the support must be scrapped. These fabrication difficulties result in costly supports and an undesirable high scrap rate.

Therefore, there is a need in the art for an improved heated support for chemical vapor deposition processes.

SUMMARY OF INVENTION

One aspect of the present invention generally provides a substrate support assembly for supporting a substrate during processing. In one embodiment, a support assembly comprising a top ceramic plate having a first side, a bottom ceramic plate having a first side and an embedded electrode, the first side of the bottom plate fused to the first side of the top plate defining a channel therebetween is provided.

In another embodiment, a support assembly includes a first plate having a first side and second side. A ring is disposed on the first side. A stepped surface is formed on the first side radially inward of the ring. A second plate is connected to the second side of the first plate.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

The present invention generally provides a processing system and heated substrate support that are advantageous for the deposition of tungsten films. The invention is illustratively described below as a chemical vapor deposition system, such as a WxZ™ metal chemical vapor deposition (MCVD) system, available from Applied Materials, Inc., of Santa Clara, Calif. However, it should be understood that the invention has utility when depositing other films and in other system configurations such as physical vapor deposition systems, chemical vapor deposition systems and any other system in which supporting a substrate on a ceramic support is desired.

Figure 1:
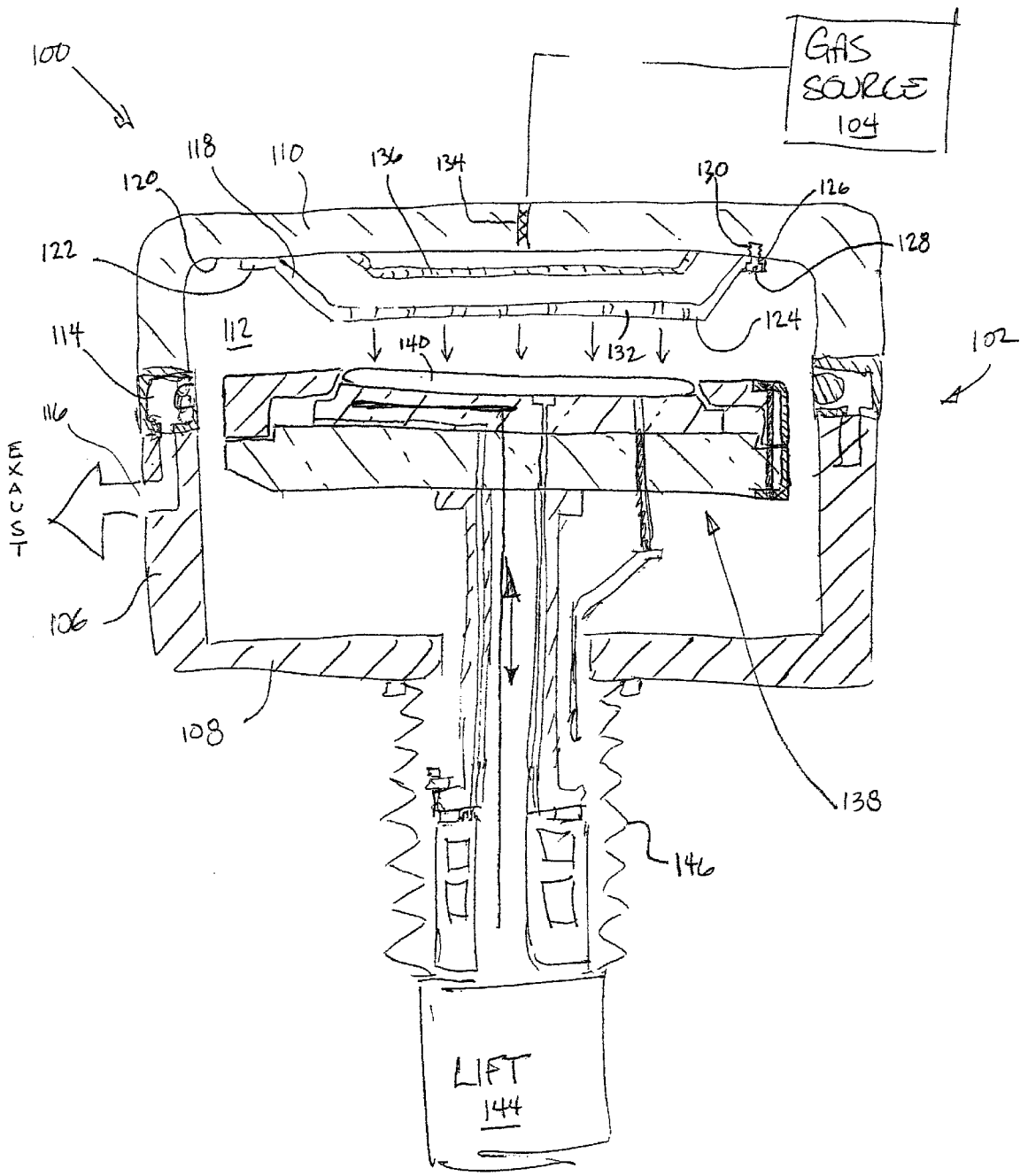
FIG. 1 depicts a schematic sectional view of one embodiment of a processing chamber of the present invention.

FIG. 1 is a cross sectional view of one embodiment of a chemical vapor deposition system 100. The system generally includes a chamber 102 coupled to a gas source 104. The chamber 102 has walls 106, a bottom 108 and a lid 110 that define a process volume 112. The walls 106 and bottom 108 are typically fabricated from a unitary block of aluminum. The chamber 100 contains a pumping ring 114 that couples the process volume 112 to an exhaust port 116 (that includes various pumping components not shown).

The lid 110 is supported by the walls 106 and can be removed to service the chamber 102. The lid 110 is generally comprised of aluminum and may additionally contain heat transfer fluid channels for regulating the temperature of the lid 110 by flowing heat transfer fluid therethrough.

A showerhead 118 is coupled to an interior side 120 of the lid 110. The showerhead 118 is typically fabricated from aluminum. The showerhead generally includes a perimeter mounting ring 122 that surrounds a "dish-shaped" center section 124. The mounting ring 122 includes a plurality of mounting holes 126 passing therethrough, each accepting a vented mounting screw 128 that threads into a mating hole 130 in the lid 110. The center section 124 includes a perforated area 132.

A mixing block 134 is disposed in the lid 110. The mixing block 134 is coupled to the gas source 104 such that process and other gases may be introduced to the process volume 112 by passing through the mixing block 134 and showerhead 118. A blocker plate 136 disposed between the showerhead 118 and the mixing block 134 increases the uniform distribution of gases passing through the showerhead 118 into the chamber 102.

A support assembly 138 is disposed beneath the showerhead 118. The support assembly 138 supports a substrate 140 during processing. The support assembly 138 is typically accessed by the substrate 140 through a port (not shown) in walls 106. Generally, the support assembly 138 is coupled to a lift system 144 that moves the support assembly 138 between an elevated position as shown and a lowered position. Bellows 146 provides a vacuum seal between the process volume 112 and the atmosphere outside the chamber 102 while facilitating the movement of the support assembly 138. Lift pins and the associated mechanisms have been omitted for clarity.

Figure 2A:
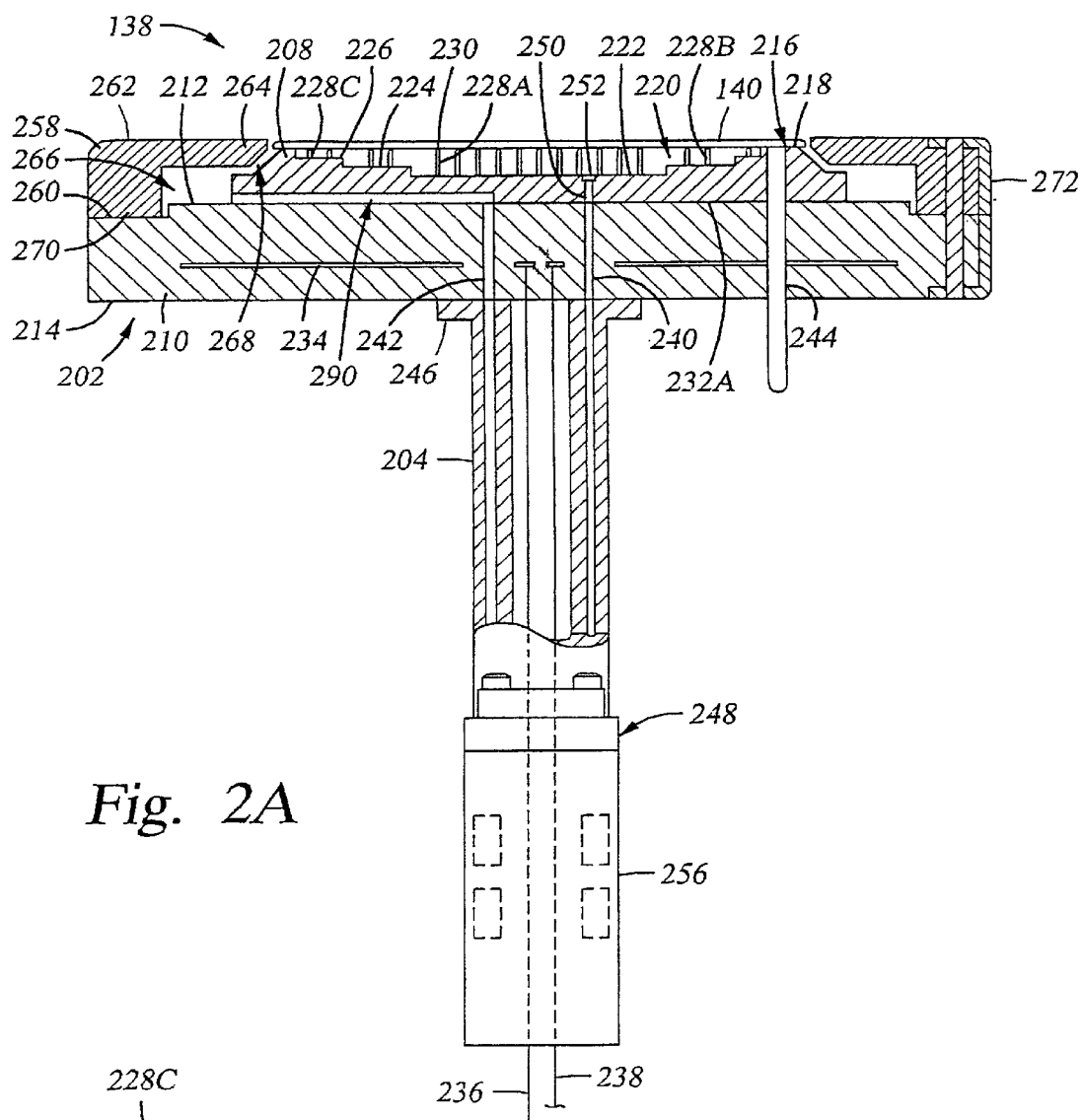
FIG. 2A depicts a partial sectional view of a heater assembly.

FIG. 2A depicts the support assembly 138 in cross section. The scale of FIG. 2A has been exaggerated to clearly depict the features of the support assembly 138. The support assembly 138 generally includes a substrate support 202 and a stem 204. The substrate support 202 is comprised of a first (upper) plate 208 and a second (lower) plate 210. The upper plate 208 supports the substrate 140 during processing. The lower plate 210 generally has a first side 212 that is connected to the upper plate 208 and a second side 214 that is connected to the stem 204. The upper plate 208 and lower plate 210 are typically fused together, for example, by clamping the plates 208 and 210 together at an elevated temperature for a period of time, typically without a bonding agent. Alternatively, the plates may be coupled by sintering, adhesives, mechanical means (i.e., fasteners), and the like.

The upper plate 208 is fabricated from ceramic, such as aluminum nitride. Preferably, about 95 percent pure aluminum nitride is used to enhance the thermal conductivity of the upper plate 208. The upper plate 208 includes a first or support surface 216 and a second surface 232A. The support surface 216 has a seal ring 218 that projects from the perimeter of the support surface 216. The seal ring 218 supports the substrate 140 at its perimeter and provides a seal therebetween to facilitate vacuum chucking of the substrate. The support surface 216 includes stepped surface 220 disposed radially inside the seal ring 218. In one embodiment, the stepped surface 220 includes a center portion 222, an intermediate portion 224 and an outer portion 226. The center portion 222 is orientated parallel to a plane defined by the seal ring 218. The intermediate portion 224 is orientated parallel to the center portion 222. The intermediate portion 224 is positioned between the center portion 222 and the seal ring 218. The outer portion 226 is orientated parallel to the center portion 222. The outer portion 226 is positioned between the intermediate portion 224 and the seal ring 218. Generally, 0.001 inches separate the planes defined by the portions 222, 224 and 226.

A plurality of posts 228A, 228B and 228C are disposed on the stepped surface 220 (e.g., portions 222, 224 and 226). The posts 228A, 228B and 228C are typically integrally formed in the upper plate 208. The posts 228A are positioned in the center portion 222. The posts 228B are positioned in the intermediate portion 224 and the posts 228C are positioned in the outer portion 226. The posts 228A are slightly longer than the posts 228B and 228C. The posts 228B are slightly longer than the posts 228C. Each of the posts 228A, 228B and 228C includes a distal end 230 that lie in a common plane. The plane defined by the distal ends 230 may be substantially co-planar to the plane of the seal ring 218 such that the substrate is supported on the distal ends 230 of the posts 228A, 228B and 228C during processing without damaging the substrate by excessive flexing (i.e., bowing the substrate across the seal ring and posts).

The stepped surface 220 provides a larger gap between the substrate and the center portion 222 to compensate for the tendency of the substrate to transfer heat to its center. Thus, the variable gap created between the substrate and the stepped surface 220 promotes better chucking effect for substrate 140 since size of caps and plural posts can be designed to attain better temperature uniformity. For example, the temperature uniformity across the support assembly 138 can be within about 3 degrees Celsius.

A vacuum port 250 is disposed through the upper plate 208. The vacuum port 250 has a varied cross section that includes an expanded portion 252 on the support surface 216 that has a generally larger cross sectional area relative the other portions of the vacuum port 250. In one embodiment, the expanded portion 252 comprises a slot having a full radius at each end. The expanded portion 252 serves to decrease the pressure drop at the interface of the vacuum port 250 and support surface 216 during the application of the vacuum. This enhances temperature uniformity, and consequently deposition uniformity on the substrate 140. One skilled in the art will readily identify that the expanded portion 252 may be configured in other geometries to accomplish the pressure reduction at the surface 216 disclosed herein.

A channel 290 is formed between the upper and lower plates 208 and 210. Generally, the channel 290 provides a passage for purge gas through the substrate support 202 to a plenum 266 defined between a shadow ring 258 and the support 202. The purge gas flows from the plenum and over the edge of the substrate to prevent deposition at the substrate's edge.

Typically, the channel 290 is formed in the upper plate 208. Optionally, a portion or all of channel 290 may be disposed completely in the lower plate 210. Optionally, some or all of the channel 290 may be disposed at least partially in the upper plate 208 and at least partially in the lower plate 210 or various combinations thereof. Common to these embodiments is that the mating of the surfaces of the upper and lower plates 208, 210 defines the channels 290 and confines travel of fluids thereto.

Figure 3A:
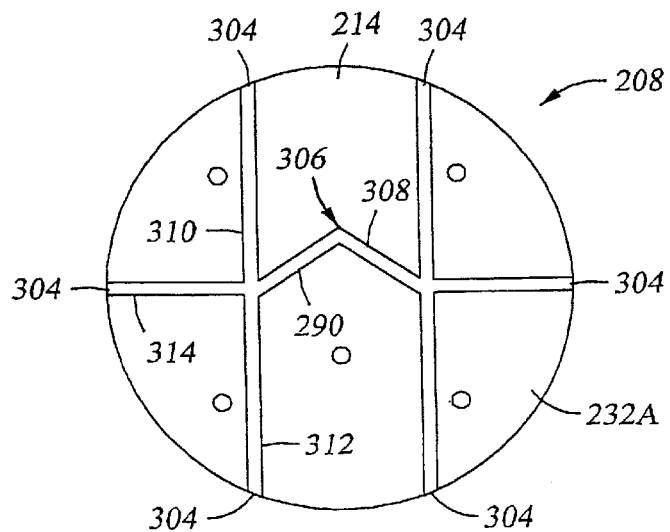
FIG. 3A depicts one embodiment of a surface of an upper plate.

FIG. 3A depicts one embodiment of the second surface 232A of the upper plate 208. In one embodiment, the second surface 232A includes a plurality of channels 290 formed therein. The channels 290 are configured to fluidly couple a plurality of outlets 304 to a central origin 306. A fluid source (not shown) supplies a fluid (e.g., purge gas) through the channels 290 from the central origin 306 to the outlets 304. As it is preferable to maintain substantially the same pressures at each outlet 304 when the outlets are spaced equidistantly about the perimeter of the second surface 232A, the geometry (i.e., cross sectional area) is tuned for each "leg" of the channels 290 to achieve this goal. As one skilled in the art will appreciate, the cross section of each leg of the channel 290 will depend on the desired pressure at the outlets 304 downstream of the leg and the flow losses encountered therebetween. The flow losses include such factors such as the surface roughness and geometry of the leg, number of outlets 304 downstream of the leg, the length of each downstream leg, the flow properties of the fluid and the like.

In the exemplary embodiment, the channels 290 include a chevron-shaped primary channel 308 positioned offset from the center of the upper plate 208. The origin 306 is positioned at the mid-point of the chevron. Each end of the primary channel 308 branches into a first secondary channel 310, a second secondary channel 312 and a third secondary channel 314. The secondary channels 310, 312 and 314 couple the primary channel 308 to the outlets 304. The first secondary channel 310 and the secondary channel 312 are co-linearly orientated and have identical cross sections. The third secondary channel 314 is orientated substantially perpendicular to the first and second secondary channels 310, 312. As the third secondary channel 314 is shorter in length than the first and second secondary channels 310, 312, the cross sectional area of the third secondary channel 314 is less than that of the first and second secondary channels 310, 312 to balance the flow of purge gas passing through the outlets 304. Optionally, flow restrictors may be placed in the outlets 304 or elsewhere in the channel to balance the flow.

Alternatively, the outlets 304 may be positioned at varying distances about the second surface 232A. In such an orientation, the flow of purge gas from the outlets 304 is desired to be non-uniform as to balance the flow of purge gas at the substrate's edge described further below. The flow of gas may be balanced by controlling the cross sections and lengths of the various channels as desired to tune the gas flow for the particular application.

Figure 3B:
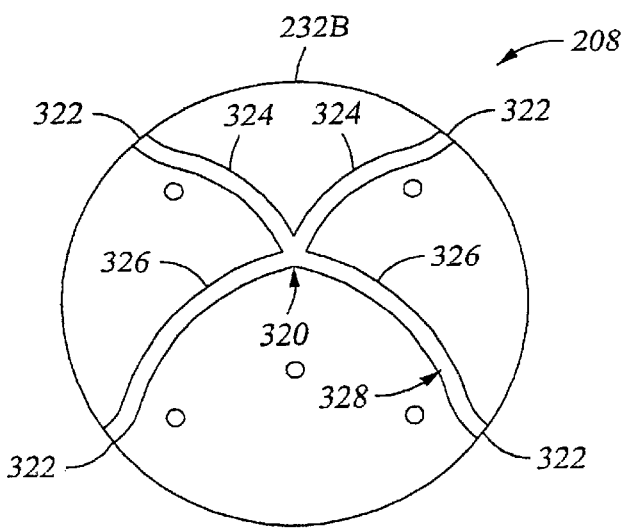
FIG. 3B depicts another embodiment of a surface of an upper plate.

FIG. 3B depicts another embodiment of a second surface 232B of the upper plate 208. Channels 328 are formed in the second surface 232B of the upper plate 208 to distribute purge gas from a central origin 320 to a plurality of outlets 322. In one embodiment, four outlets 322 are disposed equidistant about the perimeter of the second surface 232B. The outlets 322 that are closest to the central origin 320 have passages 324 disposed between the central origin and the respective outlets to provide a conduit for the purge gas. The outlets 322 that are farthest from the central origin 320 have passages 326 disposed between the central origin and the respective outlets to provide a conduit for the purge gas. To provide a uniform distribution of purge gas to the perimeter of the second surface 232B, the total flow restriction between the passages 324, 326 is balanced. Generally, this may be accomplished by having the cross sectional area of passages 326 greater than the cross sectional area of passages 324.

Figure 3C:
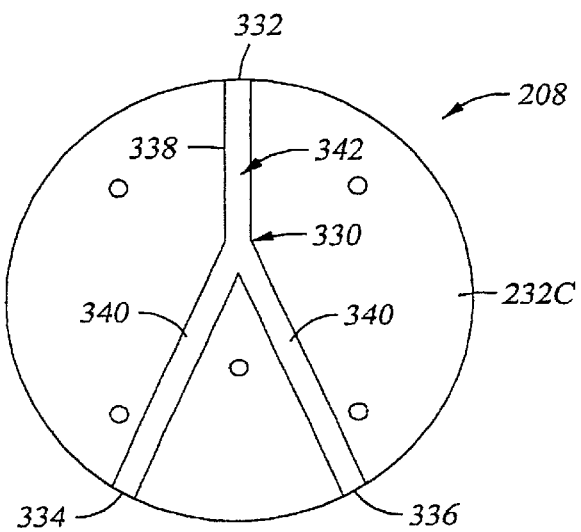
FIG. 3C depicts another embodiment of a surface of an upper plate.

FIG. 3C depicts yet another embodiment of a second surface 232C of the upper plate 208. Channels 342 are formed in the second surface 232C of the upper plate 208 to distribute purge gas from a central origin 330 to a plurality of outlets. In one embodiment, three outlets 332, 334 and 336 are disposed at varying distances about the perimeter of the second surface 232B. The outlet 332 that is closest to the central origin 330 has a passage 338 disposed between the central origin and the outlet to provide a conduit for the purge gas. The outlets 334 and 336 that are farthest from the central origin 320 have passages 340 disposed between the central origin and the respective outlets to provide a conduit for the purge gas. To provide a uniform distribution of purge gas around the substrate, the flow of purge gas through the outlet 322 must be greater than the flow through either of the outlets 334 and 336 to balance the purge gas flowing to the perimeter of the substrate. Generally, this may be accomplished by having the cross sectional area of passage 338 greater than the cross sectional area of passages 340.

Returning to FIG. 2A, the lower plate 210 is fabricated from ceramic, such as aluminum nitride. Preferably, about 95 percent pure aluminum nitride is used to enhance the thermal conductivity of the lower plate 210. The lower plate 210 includes at least one heating element, such as an embedded electrode 234, having a first lead 236 and a second lead 238 extending out the second side 214 of the lower plate 210. The leads 236, 238 are coupled to a power source (not shown). The power source supplies power to the electrode 234 to enable the support 202 to heat the substrate 140 to a temperature up to about 300–550 degrees Celsius.

Figure 2B:
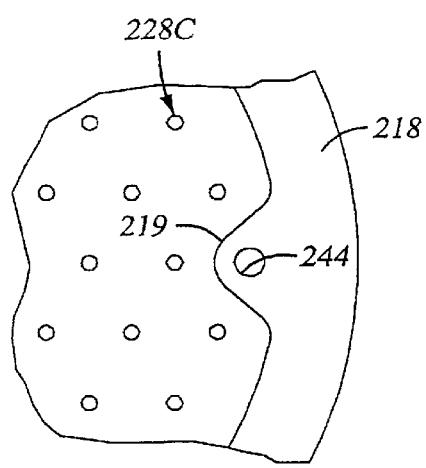
FIG. 2B depicts a partial plan view of the heater assembly.

The lower plate 210 additionally includes a vacuum passage 240, a purge passage 242 and a plurality of lift pin passages 244 extending therethrough. The lift pin passages 244 are generally disposed radially outwards from the vacuum passage 240 and the purge passage 242. The lift pin passages 244 extend from the lower plate 210 through upper plate 208, exiting the upper plate 208 through a tab 219 extending inwards and coplanar to the seal ring 218. (See FIG. 2B). The vacuum passage 240 and the purge passage 242 are generally positioned on opposing sides of the centerline of the lower plate 210.

The lower plate 210 has a stepped perimeter 260 that extends beyond the first plate 208. The stepped perimeter 260 supports the shadow ring 258. The shadow ring 258 generally is annular in form and is comprised of ceramic such as aluminum nitride. The shadow ring 258 has a first side 270 and a second side 262. The first side 270 is supported by the perimeter 260. The second side 262 has a lip 264 extending radially inwards. The lip 264 and the lower plate 210 enclose the plenum 266 that receives the purge gas exiting the outlets 304. The purge gas is disposed about the perimeter of the substrate 140 through a gap 268 that communicates with the plenum 266 defined between the lip 264 and the upper plate 208. A clip assembly 272 is utilized to retain the ring 258 to the substrate support 202. An example of a clip assembly 272 is disclosed by Yudovsky in previously incorporated U.S. Pat. Ser. No. 09/504,288 (attorney docket No. 4501).

The upper plate 208 and lower plate 210 are fused together. In one embodiment, the plates 208 and 210 are sintered. To enhance the integrity of the joint, the plates 208 and 210 should comprise similar materials (e.g., similar percentage of aluminum nitride) to minimize differences in thermal expansion. The fusing of the upper plate 208 and the lower plate 210 makes the channels 290 leak tight to about 1×E-9 sccs helium at 1×E-9 Torr differential.

Figure 4:
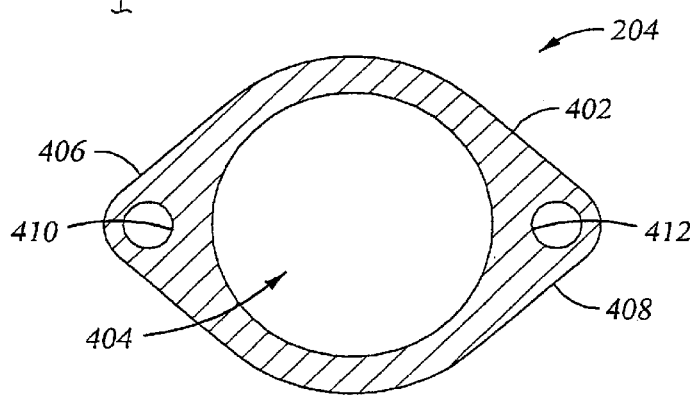
FIG. 4 depicts a cross section view of a stem.

FIG. 4 depicts the stem 204 in cross section. The stem 204 generally is fabricated from ceramic, such as aluminum nitride. Typically about 99 percent pure aluminum nitride is preferred to minimize thermal transfer between the support 202 and stem 204. The stem 204 is generally tubular in cross section. The stem 204 has an annular section 402 that defines a central passage 404. A first projection 406 and a second projection 408 extend from the annular section 402. The first projection 406 has a purge gas passage 410 and the second projection 408 has a vacuum passage 412 respectively disposed therethrough. The thickness of the annular section 402 and the walls of the first and second projections 406, 408 are selected to minimize thermal conductivity therethrough.

Returning to FIG. 2A, the stem 204 has a first end 246 and a second end 248. The first end 246 of the stem 204 is connected (e.g., fused, bonded or sintered) to the second side 214 of the lower plate 210. The leads 236, 238 pass through the central passage 404 of the stem 204 and are coupled to a power source (not shown). The union of the stem 204 and the lower plate 210 places the purge gas passage 410 disposed in the stem 204 in fluid communication with the purge gas passage 242 of the lower plate 210 and the channels 290 of the upper plate 208. Purge gas provided from a purge gas supply (not shown) may be fed through the stem 204 and out the outlets 304 disposed in the substrate support 202 to minimize deposition at the substrate's edge. Similarly, the union of the stem 204 and the lower plate 210 permits the vacuum passage 414 disposed in the stem 204 to be in fluid communication with the vacuum passage 240 of the lower plate 210 and the vacuum port 250 of the upper plate 208. A vacuum source (not shown) maintains a vacuum between the substrate 140 and the stepped surface 220 to retain the substrate 140 during processing by evacuating the volume between the substrate 140 and stepped surface 220 through the stem 204. The controlled cross section of the stem 204 minimizes the thermal transfer between the stem 204 and the substrate support 202.

An isolator 254 is disposed at the second end 246 of the stem 204 to minimize the thermal transfer therefrom. The isolator 254 is typically comprised of a thermally insulative material compatible with the process environment such as a polymer. In one embodiment, the isolator 254 comprises a polyimide, for example VESPELO®.

A heat transfer block 256 couples the stem 204 to the lift system 144. Generally, the heat transfer block 256 is used to remove heat from the system 100. The fluid temperature can be specified to control (i.e., increase, maintain, or decrease) the heat transfer of shaft 204 to heat transfer block 256, to achieve required thermal uniformity of support 202. The heat transfer block 256 is generally a thermally conductive material such as aluminum. The heat transfer block 256 isolates the bellows 146 and lift system 144 from the high temperatures associated with the support assembly 138.

Figure 5:
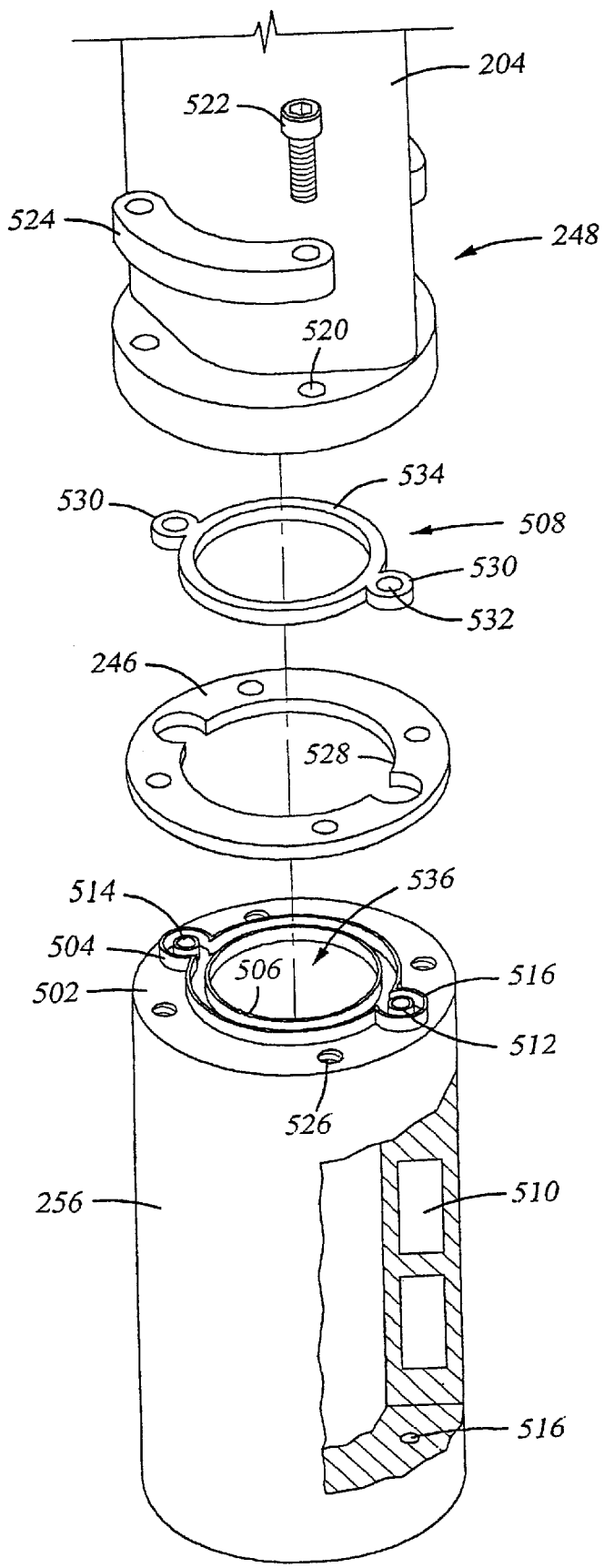
FIG. 5 depicts an exploded view of a second end of the stem.

FIG. 5 depicts an exploded view of the second end 248 of the stem 204, the insulator 254 and the heat transfer block 256. The base 248 of the stem 204 includes a plurality of mounting holes 520. A mounting screw 522, typically comprised of an alloy such as INCONEL® or HASTELLOY®, is passed through a clamp ring 524, the mounting hole 520 in the stem 204 and the insulator 254 and is threaded into a mating thread hole 526 in the heat transfer block 256. The clamp ring 524 may be separated into more than one part to facilitate assembly.

The insulator 254 includes a patterned inner diameter 528 that accommodates the geometry of a seal 508 that is disposed between the heat transfer block 256 and the stem 204. The seal 508 is generally annular and comprised of a high temperature elastomer such as CHEMREZ™, KALBEZ™, KERREZ™, INTERNATIONAL SEAL. The seal 508 includes two integral tabs 530 extending from a center ring 534. Each tab 530 has an aperture 532 formed therethrough, communicating with passages 410 and 412.

The heat transfer block 256 is generally annular in form having an axially centered passage 536. The heat transfer block 256 has a first surface 502 that has an outer projection 504 and an inner projection 506 extending therefrom. The projections 504 and 506 are configured to house the seal 508 therebetween. Optionally, two bosses 512 may extend from the first surface 502 between the projections 504 and 506.

The heat transfer block 256 additionally contains a purge gas passage 514 and a vacuum passage 516. The passages 514 and 516 extend through the heat transfer block 256 parallel to the centerline of the heat transfer block 256. The passages 514 and 516 exit the heat transfer block 256 through the bosses 512 and communicate with the passages 410 and 412, respectively, of the stem 204. The seal 508 prevents leakage at the junction of the passages 514 and 410, and passages 516 and 412.

One or more passages 510 are disposed within the heat transfer block 256. The passages 510 are coupled to a fluid source (not shown). Heat transfer fluid, such as de-ionized water, is passed through the passages 510 to regulate the temperature of the heat transfer block 256. The seal 508, being substantially enclosed by the projections 514 and 516 and the bosses 512 of the heat transfer block 256, is generally protected from heat propagated through the stem 204 from the substrate support 202 by controlling the temperature of the heat transfer block 256.

In operation, the semiconductor substrate 140 depicted in FIG. 1 is secured to the support assembly 138 by providing a vacuum therebetween. The expanded portion 252 of the vacuum port 250 minimizes the local pressure drop and corresponding temperature change of gases being drawn into the vacuum port 250, thus preventing localized cooling on portion of the substrate directly above the vacuum port 250.

The temperature of the substrate 140 is elevated to a predetermined process temperature primarily providing power to the electrode 234. The stepped surface 220 provides a variable gap that counters the tendency of the substrate 140 to have a higher temperature at the center of the substrate 140. During the deposition process, the substrate 140 is heated to a steady state temperature. Using thermal control of both the lid 110 and the support assembly 138, the substrate 140 is maintained at a temperature of 300–550 degrees Celsius Gaseous components, which in one embodiment may include silane and tungsten hexafluoride, are supplied from a gas panel to the process chamber through mixing block 134 and showerhead 118 to form a gaseous mixture. The gaseous mixture reacts to form a layer of tungsten on the substrate 140. To prevent deposition at the substrate's edge and possible adherence of substrate 140 to the support assembly 138, purge gas is flowed into the plenum 266 from the channels 290, and distributed through the gap 268 between the shadow ring 258 and the support 202 to the perimeter of the substrate 140.

Although the teachings of the present invention that have been shown and described in detail herein, those skilled in the art can readily devise other varied embodiments that still incorporate the teachings and do not depart from the scope and spirit of the invention.

What is claimed is:

1. A support assembly for supporting a workpiece comprising:

a top ceramic plate having a first side and an outer diameter;

a bottom plate having a first side and an embedded electrode, the first side of the bottom plate connected to the first side of the top ceramic plate, the bottom plate extending beyond the outer diameter of the top ceramic plate; and a channel defined between the first side of the top ceramic plate and the first side of the bottom plate, the channel adapted to flow a fluid outward of the outer diameter of the top ceramic plate.

2. The support assembly of claim 1, wherein the channel is at least partially defined in the top ceramic plate.

3. The support assembly of claim 1, wherein the channel is at least partially defined in the bottom plate.

4. The support assembly of claim 1, wherein the bottom plate further comprises:

a hole disposed through the bottom plate in communication with the channel.

5. The support assembly of claim 4, wherein the channel further comprises a plurality of passages, each passage coupling the central origin with an outlet.

6. The support assembly of claim 5, wherein the passages comprises:

one or more shorter passages; and one or more longer passages having a cross section greater than the shorter passages.

7. The support assembly of claim 5, wherein the channel and outlets are disposed in the bottom plate.

8. The support assembly of claim 5, wherein at least one of the outlets further comprises a flow restrictor disposed therein.

9. The support assembly of claim 5, wherein the channel further comprises:

a primary channel having a mid-point coinciding with the central origin; and a first secondary channel, a second secondary channel and a third secondary channel branching from each end of the primary channel, the first secondary channel, the second secondary channel and the third secondary channel each coupling the primary channel to the outlets.

10. The support assembly of claim 1, wherein the top ceramic plate further comprises:

a second surface adapted to support the substrate; and a vacuum port disposed at least partially in the second surface.

11. The support assembly of claim 1, wherein the top ceramic plate further comprises:

a second surface adapted to support the substrate;

a vacuum port disposed through the top ceramic plate; and an enlarged portion of the vacuum port disposed at least partially In the second surface.

12. The support assembly of claim 1, wherein the top ceramic plate further comprises;

a stepped surface disposed on a second side of the top ceramic plate, the second side disposed opposite the first side.

13. The support assembly of claim 12, wherein the stepped surface further comprises:

a center portion, an intermediate portion and an outer portion, wherein a center portion extends farthest below the second side of the top ceramic plate.

14. The support assembly of claim 12, wherein the stepped surface further comprises:

an outer portion;

an intermediate portion that extends 0.001 inches below the outer portion; and a center portion that extends 0.001 inches below the intermediate portion.

15. The support assembly of claim 12, wherein the stepped surface further comprises:

a plurality of posts extending therefrom.

16. The support assembly of claim 1, wherein the bottom plate further comprise aluminum nitride.

17. The support assembly of claim 1 further comprising:

a ceramic stem connected to the bottom plate.

18. The support assembly of claim 17, where the stem further comprises:

a central, axial passage;

a first gas passage disposed adjacent to the central passage; and a second gas passage disposed adjacent to the central passage.

19. The support assembly of claim 17, where the stem further comprises:

a central, axial passage;

a first gas passage disposed adjacent to the central passage; and a second gas passage disposed adjacent to the first gas passage, the second gas passage and the first gas passage on opposite sides of the central passage.

20. The support assembly of claim 1 further comprising;

a ceramic stem having a first end and a second end; the first end fused to the bottom plate; and a heat transfer block disposed coupled to the second end.

21. The support assembly of claim 20, wherein the heat transfer block further comprises:

a first surface having a plurality of projections; and a seal disposed between the projections.

22. The support assembly of claim 21 further comprising:

an insulator disposed between the heat transfer block and the stem.

23. The support assembly of claim 20, wherein the heat transfer block further comprises:

a plurality of heat transfer passages disposed therein.

24. The support assembly of claim 1, wherein the top ceramic plate further comprises:

a second side disposed opposite the first side;

a center portion, an intermediate portion, and an outer portion formed in the second side and defining a stepped surface adapted to support the substrate, wherein a center portion extends farthest below the second side of the top ceramic plate;

a plurality of posts extending from the stepped surface;

a vacuum port disposed through the top ceramic plate; and an enlarged portion of the vacuum port disposed in the center portion.

25. The support assembly of claim 1 further comprising:

a ring disposed on the second plate; and a plenum defined between the ring and the first plate, the plenum in communication with the channels.

26. A support assembly for supporting a workpiece comprising:

a top plate having a first side and second side;

a ring disposed on the first side;

a stepped surface formed on the first side radially inwards of the ring, the stepped surface having a center portion, an intermediate portion and an outer portion, wherein a center portion extends farthest below the first side of the top plate; and a bottom plate connected to the second side of the top plate.

27. The support assembly of claim 26 further comprising:
a channel defined between the second side of the top plate and the bottom plate.

28. The support assembly of claim 26 further comprising:
a heater embedded in the bottom plate.

29. The support assembly of claim 26 further comprising:
a plurality of posts extending from the stepped surface; each post having a distal end substantially coplanar with the ring.

30. The support assembly of claim 26, wherein the stepped surface further comprises:
an outer portion;
an intermediate portion that extends 0.001 inches below the outer portion; and
a center portion that extends 0.001 inches below the intermediate portion.

31. A support assembly for supporting a workpiece comprising:
a top ceramic plate having a first side;
a bottom ceramic plate having a first side and an embedded electrode, the first side of the bottom plate fused to the first side of the top plate;
a channel defined between the first side of the top plate and the first side of the bottom plate, the channel extending to a perimeter of the top plate;
a ceramic stem fused to the bottom plate having a center passage, a purge gas passage and a vacuum passage, the purge gas passage coupled to the channel; and
a cooling block coupled to the stem.

32. A semiconductor process chamber comprising:
a chamber having sidewalls and a lid defining a process volume;
a top ceramic plate having a first side disposed in the process volume;
a bottom ceramic plate having a first side and an embedded electrode, the first side of the bottom ceramic plate fused to the first side of the top ceramic plate;
a channel defined between the first side of the top ceramic plate and the first side of the bottom ceramic plate, the channel extending to a perimeter of the top plate;
a ceramic stem fused to the bottom ceramic plate having a center passage, a purge gas passage and a vacuum passage;
a cooling block coupled to the stem; and
a shadow ring disposed on the bottom ceramic plate and defining an annular plenum with the top ceramic plate, the plenum coupled to the purge gas passage by the channel.

33. The semiconductor process chamber of claim 32, wherein the chamber is a chemical vapor deposition chamber.

34. A support assembly for supporting a workpiece comprising:
a top ceramic plate having a first side;
a bottom ceramic plate having a first side connected to the first side of the top ceramic plate, the bottom ceramic plate having a diameter greater than the top ceramic plate; and
a channel defined between the first side of the top ceramic plate and the first side of the bottom ceramic plate, the channel extending to a perimeter of the top ceramic plate.

35. The support assembly of claim 34, wherein the bottom ceramic plate further comprises:
an electrode embedded therein.

* * * * *